United States Patent [19]

Fink et al.

[11] Patent Number: 5,059,804
[45] Date of Patent: Oct. 22, 1991

[54] DELTA-PHI MICROLENS FOR LOW-ENERGY PARTICLE BEAMS

[75] Inventors: Hans-Werner Fink, Gattikon; Heinz Schmid, Oberrieden; Bettina Stocker, Waedenswil, all of Switzerland

[73] Assignee: International Business Machines Corporation, Armonk, N.Y.

[21] Appl. No.: 607,175

[22] Filed: Oct. 31, 1990

[30] Foreign Application Priority Data

Dec. 13, 1989 [EP] European Pat. Off. ........ 89810951.7

[51] Int. Cl.$^5$ .............................................. H01J 49/42
[52] U.S. Cl. ......................... 250/396 R; 250/396 ML; 250/423 F
[58] Field of Search ........ 250/396 R, 396 ML, 423 F; 313/355, 336, 309

[56] References Cited

U.S. PATENT DOCUMENTS 4,785,176  11/1988  Frosien et al. .................. 250/396 R
4,954,711  9/1990  Fink et al. ....................... 250/423 R

*Primary Examiner*—Jack I. Berman
*Assistant Examiner*—Kiet T. Nguyen
*Attorney, Agent, or Firm*—John J. Goodwin

[57] ABSTRACT

The Delta-Phi microlens consists of a first foil (3) of a metal or alloy from the group of transition metals and a second foil (4) of a metal or alloy from the group comprising the elements of IA or IIA groups of the periodic system of elements, the second foil (4) being coated onto one surface of said first foil (3). A hole (2) extends through both foils (3, 4) in precise alignment with the axis (6) of a sharply pointed tip (1) made of conductive material and placed at a distance of the order of 1 μm from that surface of said first foil (3) opposite said second foil (4). With the first foil (3) connected to ground and a potential on the order of $-30$ V applied at said tip (1), at ultra-high vacuum conditions, a beam of low-energy electrons will have trajectories (5) deviated towards a focal point (7). With a positive potential of more than 30 V applied to said tip (1), and in a noble gas atmosphere, a beam of ions passing through the microlens of the invention will have trajectories (5) deflected towards said focal point (7).

12 Claims, 1 Drawing Sheet

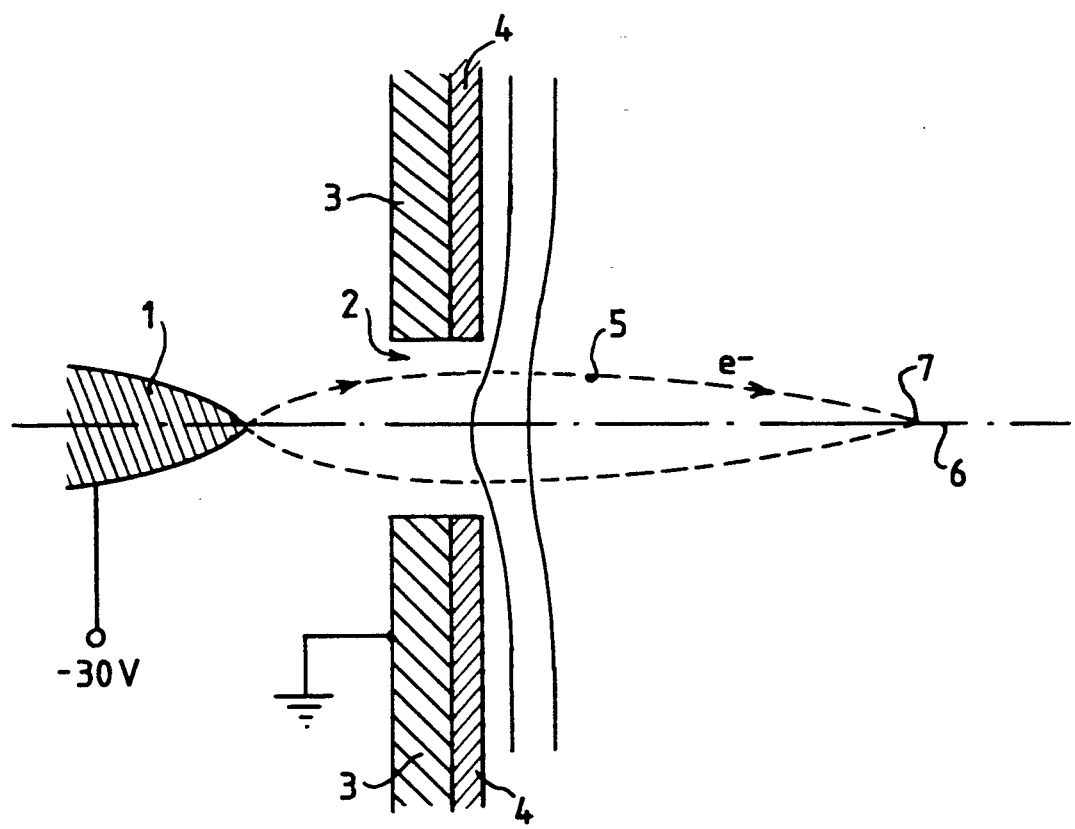

DELTA-PHI MICROLENS FOR LOW-ENERGY PARTICLE BEAMS

FIELD OF THE INVENTION

This invention relates to the structure of an electrostatic microlens for use in electron or ion microscopes. An electrostatic microlens is essentially a set of conductive plates with precisely aligned holes in them, these holes having diameters in the sub-micrometer range. The plates are usually insulated from one another. The microlenses of this type can easily be combined with a very sharply pointed conductive tip to form a source of a narrowly focused beam of electrons or ions.

As is well known in the art, in order to create a lens effect, that is, to create a deviation of the particles from the trajectories they would follow in a field-free space, different potentials are applied to the plates of the microlens to create beam-focusing gradients in the potentials with rotational symmetry in respect of the optical axis which is identical with the emitter line through the tip and through the aperture as defined by the holes of the microlens.

A microlens having an aperture of the kind mentioned above is known from (EP Application No. 88111803.8). The microlens of this reference consists of a stack of at least two metal foils held in a parallel arrangement at a distance determined by intermediary insulating media between those foils, and with a hole extending, in precise alignment, through all of the metal foils and insulator layers. The hole is given a diameter smaller than one micrometer through a special "drilling" technique described in that reference.

In order to be able to focus the particle beam as much as possible, it is desirable to not only have an aperture with a very small opening, but also to have a tip of the utmost sharpness. Theoretically, the sharpest possible tip is one that has but one single atom at its apex. Tips of that quality can actually be manufactured. A straightforward method for manufacturing stable single-atom tips has been described by H.-W. Fink in "Mono-atomic tips from scanning tunneling microscopy" in IBM Journal of Research and Development, Vol. 30, No. 5, (1986), pp. 460–465.

As in classical lens systems, the spacings (here insulating spacers) between the individual lens elements give rise to strong non-linear potential gradients at the outer edges of the lens elements. These gradients are responsible for spherical aberrations that limit the area of distortion-free optics to regions close to the optical axis.

It is, therefore, the main object of the present invention to overcome this disadvantage of the prior art by obviating the need to have insulating spacings between the lens elements. In fact, it is an object of the invention to do away with the different potentials hitherto applied to the metal layers of the prior art lenses. It is another object of the invention to generate the required potential gradients without having to apply external voltages to the aperture.

The Delta-Phi microlens of the present invention is intended for low-energy particle beams and, to this end, combined for operation with a source of particles, namely a sharply pointed tip. The microlens comprises at least two metal foils arranged in close proximity with said tip and each having a hole exactly aligned with the axis of said tip. The microlens of the invention is characterized in that one of said metal foils serves as a substrate plate, and that the other foil is coated onto at least part of that surface of said substrate plate which is facing away from said tip, and that the materials of said metal foils are chosen such that in their combination their work function difference ($\Delta\Phi$) is greatest.

Details of two embodiments of the microlens in accordance with the invention will now be described by way of example, with reference to the figure which shows the arrangement of the microlens and the tip, as well as the trajectories of the focused particles.

The invention is directed to low-energy particles, i.e. particles having energies of 30 eV or less, that are generated by a point source in combination with an aperture of sub-micrometer dimension. In such an arrangement, even small potential differences over short distances will lead to significant deflections of those low-energy particles.

While the low-energy electrons most nicely fit the scenario outlined above, one might also consider low-energy ions. However, the generation of ions by field ionization above the tip will lead to particles having energies about ten times higher than electrons generated directly at the tip. As a consequence, the higher energy ions are less conveniently controlled, i.e. the deviative effect of the microlens on the ion beam will be less prominent. Those skilled in the art will realize that, depending on the nature of the particles employed in the implementation of the invention, either an ultra-high vacuum is required or a noble gas atmosphere. The description that follows will concentrate mainly on low-energy electrons and ultra-high vacuum conditions.

In accordance with the invention, the small potential differences required to deflect the particles can be generated by a simple two-layer arrangement of conductors without insulation. Referring to the figure, aligned with the axis of a sharp tip 1 is a hole 2 in a thin metal foil 3. The thickness of metal foil may be of the order of 1 $\mu$m. The tip 1 may, for example, consist of tungsten and be sharpened so as to terminate in a trimer of atoms at its apex, or even in a single atom resting on such a trimer of atoms. The distance of tip 1 from the hole 2 in foil 3 may be about 1 $\mu$m.

A layer 4 of a metal different from the one of foil 3, is coated onto the latter on the side thereof facing away from tip 1. The coating of layer 4 may, for example, have a thickness on the order of 100 nm and be accomplished by conventional chemisorption. In general, the chemisorption can be done directly from an evaporator. In this case, the entire surface of metal foil 3 will be coated with layer 4.

While the foil-layer microlens so far described may be characterized as an immersion lens, one may consider applying another layer consisting of the material of foil 3 onto layer 4 to thus produce an einzellens. Besides the change in characteristics, the additional layer can serve to protect layer 4 from erosion, since the metals used for layer 4 are generally more reactive chemically than the transition metals.

The objects of the invention are equally served if the deposition of layer 4 is confined to the edge of hole 2 on the side of foil 3 facing away from tip 1. To this end, a focused electron beam may be used to create electron-stimulated dissociation of the physisorbed species on the aperture material.

The chemisorption of layer 4 may be done before or after drilling the hole for the aperture. The "drilling" may be performed with a focused ion beam. The abrasive forces of ion beams are well documented in the literature. Reference is also made to (EP application 88111803.8) where the manufacture of the aparture by ion milling is described.

The material of layer 4 is selected by the work function it causes upon adsorption on the material of foil 3. While the material for foil 3 is non-critical and may be taken from the large group of transition metals, comprising gold, silver, copper, nickel, etc., which all have essentially the same electronic work function of about 4.5 eV, one will wish to select the material for layer 4 from among those metals which have a considerably smaller work function.

By this token, work function differences ΔΦ, or "Delta-Phi", on the order of 3 eV can be achieved. An example for a suitable metal would be cesium deposited as the layer 4 onto a foil 3 of, e.g., tungsten. As mentioned before, layer 4 does not have to cover the entirety of foil 3 for the arrangement to work as a lens; coverage of the surroundings of the hole 2 on the side looking away from tip 1 will be sufficient.

Besides cesium as the material for layer 4, also other metals of the IA and IIA groups, respectively, of the periodic system of elements may be paired with one of said transition metals. It will be evident to those skilled in the art that the invention can also be implemented through the employ, for foil 3, of alloys of two or more transition metals, paired with a metal of the IA or IIA groups or with an alloy of those IA and/or IIA metals, as the layer 4.

With foil 3 connected to ground potential, a voltage of about −30 V applied to tip 1 (it may be −10 V to −40 V depending on ΔΦ), and the entire arrangement concealed under appropriate vacuum conditions, the trajectories 5 of the electrons e⁻ sucked from tip 1 become bent towards the axis 6 of the tip/aperture assembly and will eventually converge in a focal point 7. In the case of low-energy ions, the potential at tip 1 should be positive (and higher than 30 V, maybe up to 300 V).

The deviation of a low energy particles beam, such as electron beam 5, towards the optical axis at a certain distance from the source where the beam still has nanometer dimensions, has the consequence of increasing the brightness of the beam significantly. The brightness is independent on the deviation angle which in turn is a function of the beam energy, of the hole diameter and of the work function difference ΔΦ. In practical electron optics applications, the brightness is all that counts. For example, real time imaging, scanning speed at high resolution, as well as exposure time in lithography are all limited by the brightness of the available sources.

A comparable increase in brightness cannot be realized with classical extraction systems. Even the point source/submicron aperture setup of (EP Application 88111803.8) is not effective since the first hole of a set of holes has a defocusing optical property because of the field penetration effect caused by the presence of the tip. The second hole, kept at a higher potential, therefore, sees a much wider beam, firstly because of the defocusing effect of the first hole, and secondly because of the increased distance from the source owing to the insulating spacing between the first and second foils.

The omission of the insulating spacing will, accordingly, result in a reduction of the spherical aberrations of the lens. Even particles with trajectories close to the outer edge of the lens have a good chance of experiencing deflections leading to the focal point.

Having thus described out invention what we claim as new and desire to secure as Letters Patent, is:

1. Delta-Phi microlens for low-energy particle beams, combined for operation with a source of particles, namely a sharply pointed tip (1), and comprising at least two metal foils (3,4) arranged inclose proximity with said tip (1) and each having a hole (2) exactly aligned with the axis of said tip (1), characterized in that a first one of said metal foils (3,4) serves as a substrate plate (3), and that a second foil (4) is coated onto at least part of that surface of said substrate plate (3) which is facing away from said tip (1), and the combined materials of said first and second metal foils have a work function difference (ΔΦ) on the order of 3 eV.

2. Delta-Phi microlens in accordance with claim 1, characterized in that the material of said substrate plate (3) is chosen from the group comprising the transition metals, and that the material of said second foil (4) is chosen from the group comprising the metals, respectively, of the IA and IIA groups of the periodic system of elements.

3. Delta-Phi microlens in accordance with claim 2, characterized in that the material of said substrate plate (3) is tungsten, and that the material of said second foil (4) is cesium.

4. Delta-Phi microlens in accordance with claim 1, characterized in that the material of said second foil (4) is chemisorbed onto said substrate plate (3).

5. Delta-Phi microlens in accordance with claim 1, characterized in that the material of said second foil (4) is physisorbed onto said substrate plate (3).

6. Delta-Phi microlens in accordance with claim 1, characterized in that the material of said second foil (4) is coated onto the entire surface of said substrate plate (3) facing away from said tip 1.

7. Delta-Phi microlens in accordance with claim 1, characterized in that the material of said second foil (4) is coated onto said substrate plate (3) only in the vicinity of said hole (2).

8. Delta-Phi microlens in accordance with claim 1, characterized in that the material of said substrate plate (3) is an alloy of two or more of said transition metals, and that the material of said second foil (4) is chosen from the group comprising the metals, respectively, of the IA and IIA groups of the periodic system of elements.

9. Delta-Phi microlens in accordance with claim 1, characterized in that the material of said substrate plate (3) is chosen from the group of transition metals, and that the material of said second foil (4) is an alloy of two or more of said metals of the IA and IIA groups of the periodic system of elements.

10. Delta-Phi microlens in accordance with claim 1, characterized in that the material of said substrate plate (3) is an alloy of two or more of said transition metals, and that the material of said second foil (4) is an alloy of two or more of said metals of the IA and IIA groups of the periodic system of elements.

11. Delta-Phi microlens in accordance with claim 1, characterized in that the thickness of said substrate plate (3) is on the order of 1 micrometer, and that the thickness of said second foil (4) is on the order of 100 nanometers.

12. Delta-Phi microlens in accordance with claim 1, characterized in that said second foil (4) is coated with a third foil consisting of the material of said support plate (3).

* * * * *